United States Patent [19]

Arai et al.

[11] 4,168,343
[45] Sep. 18, 1979

[54] THERMAL PRINTING HEAD

[75] Inventors: Shoji Arai, Tsuzuki; Keizaburo Kuramasu, Katano; Sumio Maekawa, Hirakata, all of Japan

[73] Assignee: Matsushita Electric Industrial Co., Ltd., Osaka, Japan

[21] Appl. No.: 774,654

[22] Filed: Mar. 4, 1977

[30] Foreign Application Priority Data

Mar. 11, 1976 [JP] Japan .................................. 51-27542
Oct. 20, 1976 [JP] Japan ................................ 51-126600

[51] Int. Cl.² ............................................ B32B 17/06
[52] U.S. Cl. .................................... 428/426; 252/512; 252/513; 252/520; 428/427; 428/209; 428/210; 428/432; 428/539; 428/901; 428/428
[58] Field of Search .............. 428/426, 427, 901, 432, 428/539, 209, 210; 252/512, 513, 518, 520

[56] References Cited

U.S. PATENT DOCUMENTS

| 3,360,688 | 12/1967 | Triggs | 252/512 |
| 3,441,516 | 4/1969 | Mulligan | 252/512 |
| 3,794,518 | 2/1974 | Howell | 252/512 |
| 3,808,576 | 4/1974 | Castonguay et al. | 252/518 |
| 3,886,578 | 5/1975 | Eastwood | 252/518 |
| 4,039,997 | 8/1977 | Huang et al. | 428/426 |

Primary Examiner—George F. Lesmes
Assistant Examiner—E. Rollins Buffalow
Attorney, Agent, or Firm—Wenderoth, Lind & Ponack

[57] ABSTRACT

A thermal printing head having a substrate and a resistive element formed on the substrate wherein said resistive element is a thin layer which is composed of an electrically conducting material and an electrically insulating material. This thermal printing head has a high heat-resistivity, so that it may be used at a high temperature or for high speed printing.

6 Claims, 9 Drawing Figures

THERMAL PRINTING HEAD

BACKGROUND OF THE INVENTION

1. Field of the Invention

The present invention relates to a thermal printing head, and more particularly pertains to a thermal printing head of thin film type which employs a resistive element for heat generation.

2. Description of the Prior Art

Recently, a thermal printing technique has been applied, as a recording method which is maintenance free, to various recording devices such as a recorder, a printer and facsimile. Thermal printing is accomplished by bringing a thermally sensitive recording material, such as a paper provided with a coating that will turn dark when heated, into intimate contact with the thermal printing head and impressing a voltage by means of electrical supply conductors across the electrically resistive elements to form the desired symbol. For this thermal printing, various kinds of thermal heads have been developed. They can be broadly classified into three types, namely a thin film type, a thick film type and a silicon planar type. Among these three types, the thermal printing heads of the thin film type have bright prospects in view of the fact that they can be used in not only the devices of a popular type but also of a high-grade type because the resistive elements thereof may be made small.

In FIG. 1, there is shown the structure of a heat-generating element in a conventional thermal printing head of the thin film type. Referring to FIG. 1, the thermal printing head has a support member 1a of aluminum oxide or other heat-conductive material which serves as a heat sink and a flat substrate 1b, of highresistivity material, such as glass, which is attached to the support member 1a. Upon the substrate 1b are deposited, successively, a resistive layer 2 which serves as a heat-generating means, a low electrical resistive layer 3, such as double layer of chromium and gold, for the interconnection conductors or leads, protective layer 4 to protect the resistive layer 2 from oxidation, and an abrasion resistive-layer 5 to protect the resistive layer 2 from abrasion when the thermal head is brought into contact with the thermally sensitive paper. In the structure as shown in FIG. 1, tantalum nitride is often used for a material of the resistive the layer 2. Tantalum nitride is well known to show very stable characteristics when used as the resistive material of integrated circuits of the thin film type.

However, even if such a material is used, it is necessary to provide the protective layer 4 for protection of the resistive material from the oxidation which occurs because the thermal printing head is used at a high temperature. The reason why the protective layer is required is that tantalum nitride film have to be formed thin, on the order of about 500 A, to obtain an electrical resistance of about 100Ω.

Generally, a heat-resistive material for use in the resistive layer has an oxidation-resistive characteristic owing to the fact that the oxidation layer formed over the surface of the material at the time of its initial use prevents the other portion from the further oxidation. In the thermal printing head, because the thickness of the tantalum nitride film is not sufficient to allow for the formation of an oxidized layer, it becomes necessary to cover the resistive material with a protection layer.

As for a resistive material other than tantalum nitride, there are known various kinds of interstitial alloys such as nitrides, carbides, boronides and silicides, and various kinds of materials used for heaters such as nichrome alloys. However, these materials have almost the same specific-resistivity as that of tantalum nitride, so that it is also necessary to form a protective layer thereon.

In order to solve the problem as described above, there may be adopted a method in which a relatively thick layer is formed and the surface portion thereof is oxidized by a heat treatment so as to prevent the oxidation. This method is known as the method of adjusting the value of electrical resistance of a $TaN_2$ layer used in an integrated circuit of the thin film type. However, this method is not available for practical use because it is difficult to obtain a large number of the elements with the same electrical resistivity, and the process for making the thermal printing head is troublesome.

OBJECTS OF THE PRESENT INVENTION

Therefore, it is an object of the present invention to provide a thermal printing head in which a protective layer for the resistive element is not necessary despite the use of conventional materials.

It is another object of the present invention to provide a thermal printing head which may be used at a high temperature.

It is a further object of the present invention to provide a thermal printing head which permits high speed recording.

It is a still further object of the present invention to provide a thermal printing head which can be manufactured easily.

Other and further objects, features and advantages of the present invention will appear more fully from the following description.

DETAILED DESCRIPTION OF THE DRAWINGS

DETAILED DESCRIPTION OF THE PRESENT INVENTION

Figure 1:
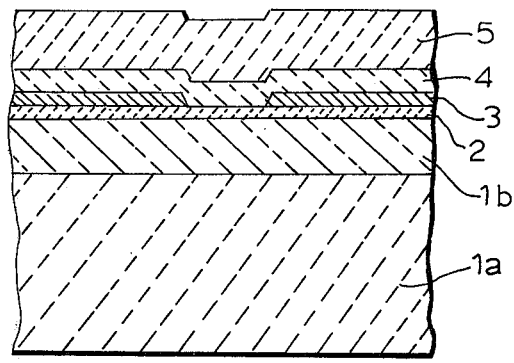
FIG. 1 is a sectional elevation showing the heat-generating portion of a conventional thermal printing head.
Figure 2:
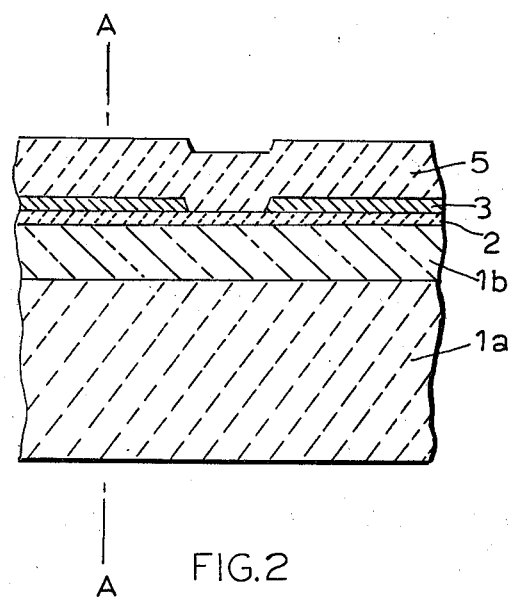
FIG. 2 is a sectional elevation showing the heat-generating portion of a thermal printing head according to the present invention.

In accordance with the present invention, a thin layer of a resistive element is composed of a mixture of an electrically conductive material used conventionally as a resistive material and an electrically insulating material. By using this resistive element in a thermal printing head, the protection layer 4 shown in FIG. 1 may be omitted as shown in FIG. 2. In FIGS. 1 and 2, the elements indicated by the same numerals are identical.

Details of the present invention will be described in the following Examples.

EXAMPLE 1

Figure 3:
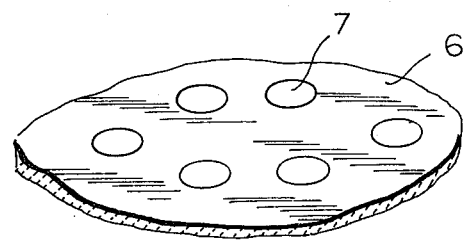
FIG. 3 shows a sputtering target employed in forming a thin layer of a resistive element in accordance with the present invention, by the sputtering technique.

In this Example, TiC is used as the resistive material, and $SiO_2$ as the electrically insulating material. As shown in FIG. 3, there is prepared a target composed of a TiC disk having hollows 6 with a circular shape and a quartz disc 7 embedded in each of the hollows. By subjecting this target to a conventional vacuum sputtering, a thin layer of the mixture of $TiO_2$ and $SiO_2$ is formed.

Figure 4:
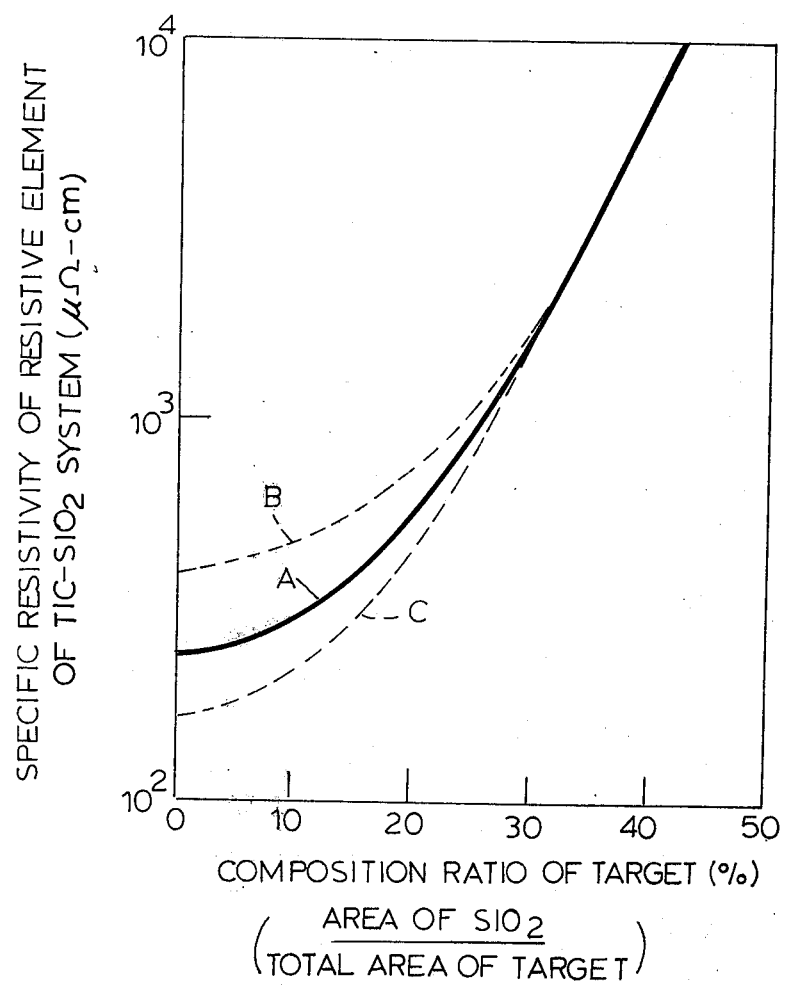
FIG. 4 is a graph showing a relation between the specific resistivity of thin layer of a resistive element and the composition of the target used in the sputtering method.

In FIG. 4, there is shown the relation between the specific-resistivity of the thin layer and the composition ratio of the target. The characterstic curve A is for a thin layer obtained under condition such that the TiC disc is 150 mm $\phi$ in diameter, the quartz discs are varied in size, number and arrangement, and the sputtering is performed on a glass substrate a 400° C. in Ar gas at a pressure of $4 \times 10^{-2}$ Torr. This relation can be changed by varying the size of the target, the manner of attaching the disk, and sputtering conditions such as substrate temperature, evaporation rate, etc. However, it seems that the characteristic curve A in FIG. 4 shows a general characteristic of the thin resistive layer of the present invention. For example, the curved line B in FIG. 4 shows the specific-resistivity of the thin layer which is composed of, as the electrically insulating material, $SiO_2$ and, as the resistive material, a material with a relatively higher specific-resistivity than that of TiC, and which is formed under the same conditions as those described above. The curves line C in FIG. 4 shows the specific-resistivity of the thin resistive layer which is composed of, as the electrically insulating material, $SiO_2$ and, as the resistive material, a material with a relatively lower specific-resistivity than that of TiC, and which is formed under the same conditions as those described above. As will be seen from FIG. 4, the differences in the specific-resistivity between the cruved lines A, B and C become small with increasing amount of the electrically insulating material. This relation is found by studying the combinations of materials.

On the basis of the result shown in FIG. 4, there were prepared thin layers composed of TiC and a layer of a material from the TiC $SiO_2$ system with a specific-resistivity 20 times higher than that of TiC. Then, these two layers were subjected to heat-treatment in air for 1 hr at a temperature of 500° C. and the specific-resistivities of the thus treated layers were measured. In the TiC thin layer, the specific-resistivity was found to be above $10^4 \Omega$ cm and the metallic luster of the thin layer was changed to transparent. On the other hand, in the thin layer of material from the TiC-$SiO_2$ system, the surface portion was oxidized slightly but the specific-resistivity measured after the oxidized layer was etched off carefully, was found to be almost unchanged from that of the initial condition. This result shows that the resistive element of the present invention can have a high-oxidation resistivity although conventional materials are employed as the resistive material.

In the foregoing example, the resistive element is composed of TiC and $SiO_2$. However, a resistive element composed of $TiSi_2$ and $SiO_2$ will be superior thereto in oxidation resitivity because the oxidized layer formed on the surface of $TiSi_2$ is thinner than that of TiC as will be described later.

EXAMPLE 2

In this Example, the resistive element is composed of, as the resistive material, $VSi_2$ which is known as a heat-resistive silicide and, as the electrically insulating material, Si. This resistive element was formed by sputtering as described in Example 1. The relation between the specific-resistivity of the thin layer obtained by the sputtering and a composition ratio of the target showed almost the same tendancy as that in FIG. 4. The improvement in the oxidation resistivity of the resistive element according to the present invention was found by comparison with the thin layer obtained by sputtering only $VSi_2$, in the same way as in Example 1.

It is known that the specific-resistivity of $VSi_2$ is about 9.5 $\mu\Omega$-cm. The specific-resistivity of the thin layer which is obtained by sputtering a target available on the market as $VSi_2$, onto a substrate at 450° C., was found to be 230 $\mu\Omega$-cm. On the basis of this result, a resistive element having a resistance of 100$\Omega$ was obtained, in which the aspect ratio 1/w was 1 and the thickness of the thin layer was 460 A. On the other hand, as regards the thin layer of material from the Si-$VSi_2$ system, the composition ratio of Si and $VSi_2$ in the target was selected so that the resistance of the resistive element was 100$\Omega$, the aspect ratio 1/w was 1 and the thickness was 20 times thicker than that of the $VSi_2$ thin layer, that is, the thickness was 9200 A. These two thin layers were subjected to a heat-treatment in air for 1 hr at 500° C., in the same way as in Example 1. The thus treated thin layers were compared with those before the heat-treatment, respectively. As the $VSi_2$ thin layer, the sheet resistance is found to be three times higher than that before being subjected to the heat-treatment. On the other hand, as for the thin layer of the material from the Si-$VSi_2$ system, the condition of the surface did not change and the sheet resistance was found to be increased by 10% as compared with that before being subjected to the heat-treatment. This increase in the resistance has a close relationship to the composition ratio of Si and $VSi_2$ in the thin layer. For instance, where the amount of Si is decreased in order that the specific-resistivity will be about 10 times higher than that of a thin layer of $VSi_2$, the specific-resistivity after being subjected to the heat-treatment decreases by 30%. This means that the resistive layer has considerably improved oxidation resistivity.

Furthermore, there were prepared two thin layers that is a layer composed of, as the resistive material, $VSi_2$ and, as the electrically insulating material, Si, and a layer composed of $VSi_2$ and $SiO_2$, and then, a comparison between the oxidation resisturties was made. As a result, it was confirmed that the thin layer of material from the $VSi_2$-Si system is superior in oxidation—resistivity.

The reason why the resistive element of this invention has an excellent oxidation-resistivity as described in Examples 1 and 2 is explained hereinafter.

Figure 5:
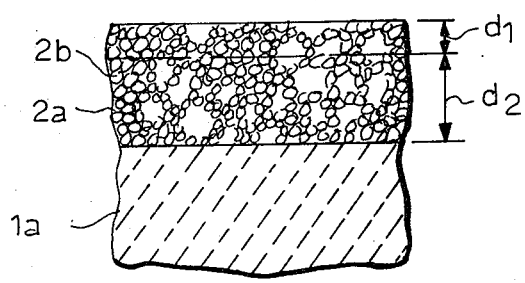
FIG. 5 is a sectional elevation showing the concept of the structure of a thin layer of resistive element of a the present invention.

FIG. 5 shows the concept of the structure of the resistive element of the present invention. In FIG. 5, the resistive element 2 comprises fine particles of the resistive material (the electrically conductive material) 2a and the electrically insulating material (2b). The fine particles of the resistive material constitute the electrically conductive portion of the element. When such a resistive thin layer is used in an oxidizing atmosphere at a high temperature, the thin layer is gradually oxidized from the surface to the inside. However, when the oxidized portion grows to a certain thickness $d_1$, the thin layer is not oxidized at that temperature any longer. Therefore, if the thickness $d_1$ is relatively small in comparison with the thickness $d_2$ of the unoxidized portion, the change of resistance of the resistive layer becomes small. The particles of the electrically insulating material dispersed in the resistive thin layer serve to make the thin layer thicker with the resistance of the thin layer keeping the required value and serves to make the thickness $d_1$ smaller so that the resistive thin layer will have an excellent oxidation—resistivity.

Hereinafter, there will be described combinations of the resistive materials and the electrically insulating materials.

EXAMPLE 3

As for the resistive materials, there can be used, as described above, carbides, silicides, borides and nitrides, of Ti, Ta, V, Zr, Nb, Cr, Mo, W, known as interstitial alloys with a low resistance, or there can be used materials such as Ni-Cr, etc., known as materials for heaters. Among these materials, silicides are superior to carbides, borides and nitrides, because the thickness of the oxidized portion formed by exposing them to air at a high temperature is less than for the other materials.

As for the electrically insulating material, there can be used Si; the oxides such as $SiO_2$, $ZrO_2$, $ThO_2$, etc.; a material having a relatively high specific-resistivity such as nitrides, silicides, borides and carbides; and various kinds of glass materials. Among these materials, Si, $SiO_2$ and various kinds of glass materials have an especially excellent oxidation-resistivity.

If the electrically insulating material has a sufficiently high oxidation-resistivity, a pure substance such as Ti, Ta, V, Zr, Nb, Cr, Mo, W, Ni, etc., may be used as the resistive material. For instance, a resistive element which comprises at least one of these pure substances and $SiO_2$ has an excellent oxidation-resistivity.

Figure 6:
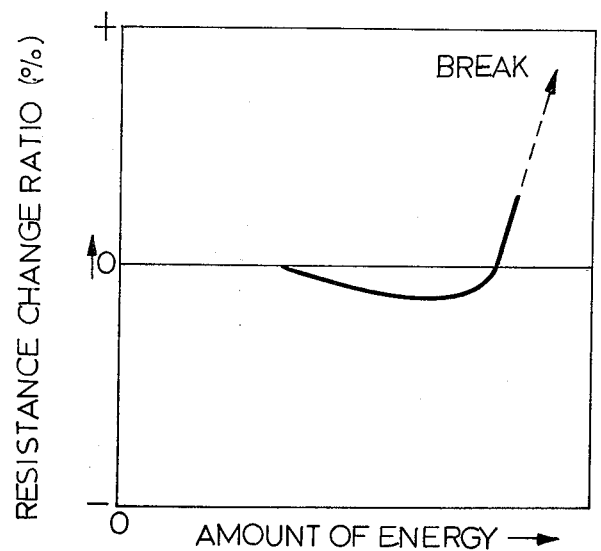
FIG. 6 is a graph showing the relation between the resistance-change ratio of a resistive element and the amount of energy applied thereto in a step-stress test.

Furthermore, in using the thermal printing head, a large number of heat pulses are repeatedly applied to the resistive element so that the element becomes thermally fatigued or peels off from the substrate or is cracked or in the shape thereof is changed due to the difference in the coefficient of expansion between the abrasive-resistance layer and the substrate. FIG. 6 is a graph showing the relation between the ratio of resistance-change in the resistive element and the amount of energy applied thereto in a step-stress test. The step-stress test is performed by adding a certain level of energy to the resistive element in a series of steps in a manner such that the total amount of energy increases with each repeated step. In the present test, the period of one step is about 5–30 minutes. The characteristic curve in FIG. 6 shows the general tendency of the resistance change in the resistive element under the step-stress test. As will be seen from FIG. 6, the resistance of the resistive element decreases with increasing energy in the range before the element is broken. This decrease of the resistance is caused by the grain-growth of the crystalline grains of the resistive material. This grain-growth also occurs in the crystalline grains of the electrically insulating material. However, in the composition range of the resistive element which can be used for the thermal printing head, the grain-growth of the resistive material dominates the character of the resistive element rather than that of the electrically insulating material. The decrease of the resistance in the range before the element is broken, also appears in a resistive element having a composition such that the specific-resistivity increases during heat-treatment. In this case, the less the resistance in the initial steps decreases, and the greater is the positive temperature coefficient of specific-resistivity of the resistive element, the more is the total amount of energy necessary to add to the element before it is broken. Thus, the resistive material should be selected from the materials with a positive temperature coefficient of specific-resistivity. In consideration of these points, among the materials described above, the combination of the pure substances or silicides thereof, as the resistive material, and Si or $SiO_2$, as the electrically insulating material, should be used.

Where the quality of the resistive element for use in the thermal printing head is considered, it is desirable that the total amount of energy which can be added before the resistance change of the resistive element exceeds the maximum permissible range, is large. In the ordinary thermal printing head, the maximum permissible range is about 10%.

In order to confirm this point, there were prepared thermal printing heads, as shown in FIG. 2, which comprised the resistive element composed of the mixture as listed in Table 1 and an abrasion-resistive layer of SiC of 5μ thickness.

Table 1

| Electrically Insulating Material | Resistive Material |
| --- | --- |
| $SiO_2$ or Glass Si | Pure Substance of Ti, Ta, Cr and Nb or Silicide of this pure Substance or Ni—Cr Silicide of Ti, Ta, Cr, Nb, Zr V and Mo |

To the thermal printing head, energy of 20 w/mm² (a pulse width, 4 msec; an interval of repetition, 20 msec) was applied for 500 hr. As a result, it was confirmed that the ratio of resistance-change of the resistive element was less than 10% and no cracks occured. Since the amount of the maximum permissible energy seems to depend on the deformation of the glass substrate, further improvement can be made by examination of the substrate material.

In forming the resistive element as described above, the following requirements have to be satisfied. Namely, (1) preventing grain-growth, (2) making the crystalline grains fine, and (3) keeping the composition ratio of the resistive element and the electrically insulating material in the required range. The sputtering method can satisfy the requirements (2) and (3) so that it is superior to any other technique for forming a thin layer. As for the sputtering method, there may be considered various kinds of modifications such as a method employing a plurality of targets instead of one target or a method employing a sputtering gun of a magnetron type which has been developed recently.

As was seen from Example 2, the resistive layer composed of silicide and Si can also be formed by sputtering with the target 9 being composed of a pure metal silicide and the target 10 composed of Si. In this case, the higher the substrate temperature, the more the formation of silicide is promoted so that the resistive element with excellent characteristics may be obtained. For this purpose, it is necessary that the substrate temperature be more than 400° C. Where the substrate temperature is 450° C., it is confirmed that there may be obtained a resistive layer having almost the same characteristics as those obtained by sputtering with targets of silicide and Si.

EXAMPLE 4

Figure 7:
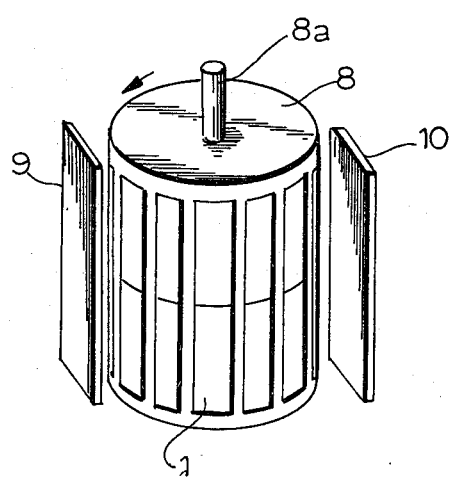
FIG. 7 shows an example of the sputtering equipment employed for the formation of a resistive element of the present invention.

FIG. 7 shows sputtering equipment for forming the resistive element. In FIG. 7, the reference numeral 8 designates a cylindrical substrate-holder and the numerals 9 and 10 denote targets. The targets 9 and 10 are composed of the resistive material and the electrically insulating material, respectively. In such an arrangement, the resistive element of the present invention is formed by sputtering, with the holder 9 rotated around a shaft 8a. It is confirmed that a resitive element composed of TiC and $SiO_2$ which is formed by this method has almost the same characteristics as that in Examples 1 and 2 where the substrate temperatures are the same.

In the following, there will be described the etching of the resistive element formed on the substrate.

EXAMPLE 5

Figure 8:
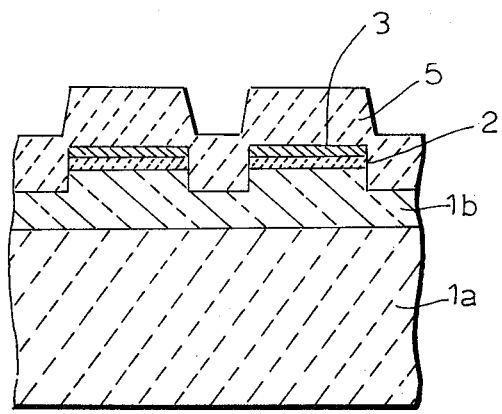
FIG. 8 is a sectional elevation taken generally along the ling A—A of FIG. 2.
Figure 9:
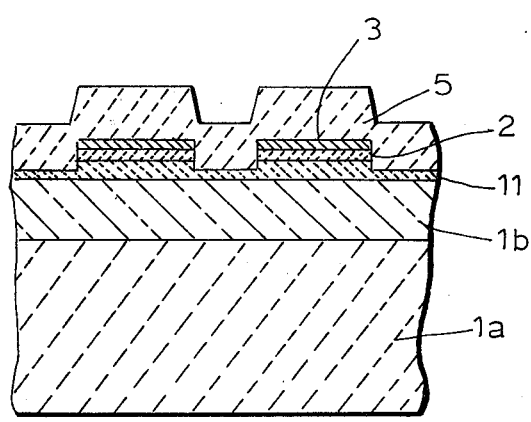
FIG. 9 is a sectional elevation showing another embodiment of the thermal printing head of the present invention.

FIG. 8 is a section taken generally along the line A—A of FIG. 2. The thermal printing head is made by the following steps. Namely, the resistive thin layer 2 constituting the resistive element is formed on the entire surface of the substrate 1b, and the electrode layer 3 is deposited on the resistive thin layer. Then, these two layers are etched by the use of the same mask, and the desired portions of the electrode layer are etched away, and then, using the same mask, the resistance layer remaining exposed is etched away. Thereafter, the abrasion-resistive layer 5 is provided as shown in FIG. 8. In this case, if the resistive layer is one of the layers in Table 1, fluonitric acid is used as the etchant. The etchant etches not only the resistive layer but also a part of the glass substrate 1b. If the glass substrate 1b is etched, it becomes difficult to form fine patterns of the heat-generation elements. In order to prevent the etching of the glass substrate, an etching-protection layer composed of an electrically insulating material which can resist the action of etchant is provided between the glass substrate and the resistive layer. As for the material of etching-protection layer, there can be used as oxide such as $Al_2O_3$, $ThO_2$, $MgO$, or $Cr_2O_3$; a carbide such as SiC; and a nitride such as $Si_3N_4$ or BN. In FIG. 9, there is shown a thermal printing head which employs the etching-protection layer 11. In this example, the resistive thin layer is composed of, as the resistive material, Ti and, as the electrically insulating material, $SiO_2$, and the etching-protection layer is composed of $SiO_2$ which is the same material as the electrically insulating material. The etching-protection layer and the resistive thin layer are formed by using the equipment shown in FIG. 7. Namely, the etching-protection layer is formed by employing the target 9 composed of $SiO_2$, and the resistive thin layer is formed by employing the $SiO_2$ target 9 and the target 10 composed of Ti.

As a result of experiment, it is confirmed that where the thickness of the resistive thin layer is less than 1μ, an etching-protection layer of 0.3μ can fully protect the glass substrate from the etching.

Furthermore, the use of the resistive element of the present invention make possible an increase the number of materials which can be used as the electrode. In etching the resistive layer, it is indispensable to the electrode that the electrode not be etched with the etchant for the resistive layer. Where fluonitric acit must be used as etchant, copper cannot used as the electrode because it is etched by the etchant easily. However, according to the present invention, the material of the resistive layer can be composed of $SiO_2$ and Ti so that a mixture of HF and $NH_4F$ can be used as the etchant. This etchant does not have the capability to etch copper, so that copper can be used as electrode.

Another modification to make possible the adoption of various electrode materials is to use an etchant that can etch only the electrically insulating material in the resistive layer or an etchant that contains a mixture of the HF-$NH_4F$ etchant and the liquid which can etch slightly the resistive material (electrically conductive material.)

Moreover, in accordance with the present invention, various kinds of materials can be used as the resistive element, as described above. Therefore, if the materials of the resistive element and the electrode are selected suitably, it is possible to avoid alloy formation by these materials. Thus, the thermal printing head may be used at a higher temperature.

As will be seen from the foregoing, the advantages of the thermal printing head of the present invention are as follows (1) It has a high heat-resistivity since the resistance change of the resistive material caused by the oxidation can be restricted within a narrow limit.

(2) It may be manufactured easily since the resistive element can be formed by various kinds of conventional techniques for thin film formation.

(3) It is not necessarily to have a protective layer for the protection of the resistive element from oxidation.

(4) It can employ abrasion-resistive materials which do not have large oxidation resistance.

(5) It can employ various kinds of electrode materials.

(6) It may be made thin since the resistive layer can be so formed as to have high specific-resistivity on the order of KΩ so that a thinner electrode can be used, in comparison with that of a conventional head.

Thus, the thermal printing head of the present invention is of high industrial value.

What we claim is:

1. In a thermal printing head comprising a substrate of a high resistivity material, a thin layer of a resistive element on said substrate, an electrode layer of electrical conductivity material on said thin layer, and an abrasion resistive layer directly on said electrode layer, the improvement wherein said resistance element is composed of an electrically insulating material in a matrix of electrically conducting material.

2. The improvement according to claim 1 wherein said electrically conducting material is a material selected from the group consisting of Ti, Ta, Cr, Nb, a silicide of the said metal, Zr, V, Mo and a Ni-Cr alloy.

3. The improvement according to claim 1 wherein said electrically insulating material is a material selected from the group consisting of $SiO_2$, Si and glass.

4. The improvement according to claim 1, further comprising a etching-protective layer provided between said resistive element and said substrate for a protection of the substrate from an etchant.

5. The improvement according to claim 4, wherein said etching-protective layer is the same material as said insulating material contained in said resistive element.

6. The improvement according to claim 1, said resistive element is a sputtered layer of said electrically conducting and electrically insulating material.

* * * * *